US012591133B2

(12) United States Patent
Morits et al.

(10) Patent No.: US 12,591,133 B2
(45) Date of Patent: Mar. 31, 2026

(54) ENHANCED MICROELECTROMECHANICAL SYSTEM MIRROR APPARATUS

(71) Applicant: Teknologian tutkimuskeskus VTT Oy, Espoo (FI)

(72) Inventors: Dmitry Morits, Espoo (FI); Jukka Kyynäräinen, Espoo (FI)

(73) Assignee: Teknologian tutkimuskeskus VTT Oy, Espoo (FI)

( * ) Notice: Subject to any disclaimer, the term of this patent is extended or adjusted under 35 U.S.C. 154(b) by 276 days.

(21) Appl. No.: 18/288,578

(22) PCT Filed: Apr. 22, 2022

(86) PCT No.: PCT/FI2022/050262
§ 371 (c)(1),
(2) Date: Oct. 27, 2023

(87) PCT Pub. No.: WO2022/229506
PCT Pub. Date: Nov. 3, 2022

(65) Prior Publication Data
US 2024/0369826 A1 Nov. 7, 2024

(30) Foreign Application Priority Data

Apr. 27, 2021 (FI) ...................................... 20215490

(51) Int. Cl.
*G02B 26/08* (2006.01)
*B81B 7/00* (2006.01)
*G02B 26/10* (2006.01)

(52) U.S. Cl.
CPC ........ *G02B 26/0858* (2013.01); *B81B 7/0045* (2013.01); *G02B 26/101* (2013.01); *B81B 2201/042* (2013.01)

(58) Field of Classification Search
CPC .............. G02B 26/0858; G02B 26/101; G02B 26/105; G02B 26/0833; B81B 7/0045; B81B 2201/042
See application file for complete search history.

(56) References Cited

U.S. PATENT DOCUMENTS 6,830,944 B1 12/2004 Smits
2004/0160008 A1* 8/2004 Sawyer .............. A63F 3/00157
273/292

(Continued)

*Primary Examiner* — Euncha P Cherry
(74) *Attorney, Agent, or Firm* — Laine IP Oy

(57) ABSTRACT

According to an example aspect of the present invention, there is provided a Microelectrical System, MEMS, mirror apparatus, comprising a MEMS mirror, at least two pairs of actuation units, wherein each pair comprises a first and a second actuation unit and a first actuation unit of a first pair of actuation units comprises a stress relief unit, an inner actuator and an outer actuator, and the stress relief unit is coupled to the MEMS mirror and to the inner actuator, one end of the inner actuator is coupled to the stress relief unit of the actuation unit and another end of the inner actuator is coupled to the outer actuator of the actuation unit, the stress relief unit of the first actuation unit of the first pair of actuation units is in between the MEMS mirror and an inner actuator of a second actuation unit of a second pair of actuation units, and the inner actuator of the first actuation unit of the first pair of actuation units is in between a stress relief unit of a second actuation unit of the first pair of actuation units and an outer actuator of a second actuation unit of a second pair of actuation units.

15 Claims, 8 Drawing Sheets

(56)         References Cited

U.S. PATENT DOCUMENTS

| | | |
|---|---|---|
| 2004/0160118 A1 | 8/2004 | Knollenberg et al. |
| 2006/0018049 A1 | 1/2006 | Mizuno |
| 2018/0059406 A1 | 3/2018 | Torkkeli |
| 2020/0386985 A1 | 12/2020 | Liukku et al. |
| 2020/0393545 A1 | 12/2020 | Shani et al. |

* cited by examiner

ENHANCED MICROELECTROMECHANICAL SYSTEM MIRROR APPARATUS

FIELD

Embodiments of the present invention relate in general to a Microelectromechanical System, MEMS, mirror.

BACKGROUND

Microelectromechanical System, MEMS, mirrors are miniature mirrors, which may be used for example in projectors, displays, imaging and fiber-optic communications. MEMS mirror-based scanners are advantageous compared to other types of scanners in terms of size, speed and cost. Thus, MEMS mirrors are ideal for a wide range of applications, such as Light Detection and Ranging, LiDAR, applications. In general, it is desirable to provide robust MEMS mirrors with low power consumption, wide deflection angles and high reflectivity for circular and/or Lissajous scanning.

SUMMARY OF THE INVENTION

According to some aspects, there is provided the subject-matter of the independent claims. Some embodiments are defined in the dependent claims.

According to a first aspect of the present invention, there is provided a Microelectrical System, MEMS, mirror apparatus, comprising a MEMS mirror, at least two pairs of actuation units, wherein an actuation unit of a first pair comprises an inner actuator, an inner stress relief unit, an outer actuator and an outer stress relief unit, and one end of the inner actuator is coupled to or comprises the inner stress relief unit of the actuation unit and another end of the inner actuator is coupled to the outer actuator via the outer stress relief unit, the inner stress relief unit is coupled to the MEMS mirror, one end of the outer actuator is coupled to an anchor between the outer actuator and an outer actuator of an actuation unit of a second pair of actuation units and another end of the outer actuator is coupled to the outer stress relief unit.

According to a second aspect of the present invention, there is provided MEMS mirror apparatus, comprising: a MEMS mirror, at least two pairs of actuation units, wherein each pair comprises a first and a second actuation unit and a first actuation unit of a first pair of actuation units comprises a stress relief unit, an inner actuator and an outer actuator, and the stress relief unit is coupled to the MEMS mirror and to the inner actuator, one end of the inner actuator is coupled to the stress relief unit of the actuation unit and another end of the inner actuator is coupled to the outer actuator of the actuation unit, the stress relief unit of the first actuation unit of the first pair of actuation units is in between the MEMS mirror and an inner actuator of a second actuation unit of a second pair of actuation units, and the inner actuator of the first actuation unit of the first pair of actuation units is in between a stress relief unit of a second actuation unit of the first pair of actuation units and an outer actuator of a second actuation unit of a second pair of actuation units.

EMBODIMENTS

Embodiments of the present invention relate in general to Microelectromechanical System, MEMS, mirrors. More specifically, embodiments of the present invention allow low voltage excitation and large tilt angle for circular and/or Lissajous scanning. Stress relief units, such as lever arms, may be exploited to provide high tolerance to mechanical breakage and enhance vertical displacement of actuation units. For instance, stress relief units having a meander structure may be used to increase a moment of inertia of a vibrating structure of a MEMS mirror apparatus and to reduce a spring constant to lower a mechanical resonance frequency. In some embodiments, asymmetric design of the MEMS mirror apparatus allows optimization of resonant frequencies. Embodiments of the present invention may be exploited in various applications, such as medical imaging, environmental sensing and optical communication links.

In some embodiments of the present invention, a MEMS mirror may be used to refer to a Micro-Opto-Electromechanical System, MOEMS, mirror. A MOEMS mirror may be a mirror that is used in optical applications. That is to say, a MEMS mirror may be a general term, which is not limited to any specific application, and a MEMS mirror covers for example a MOEMS mirror as well.

Figure 1:
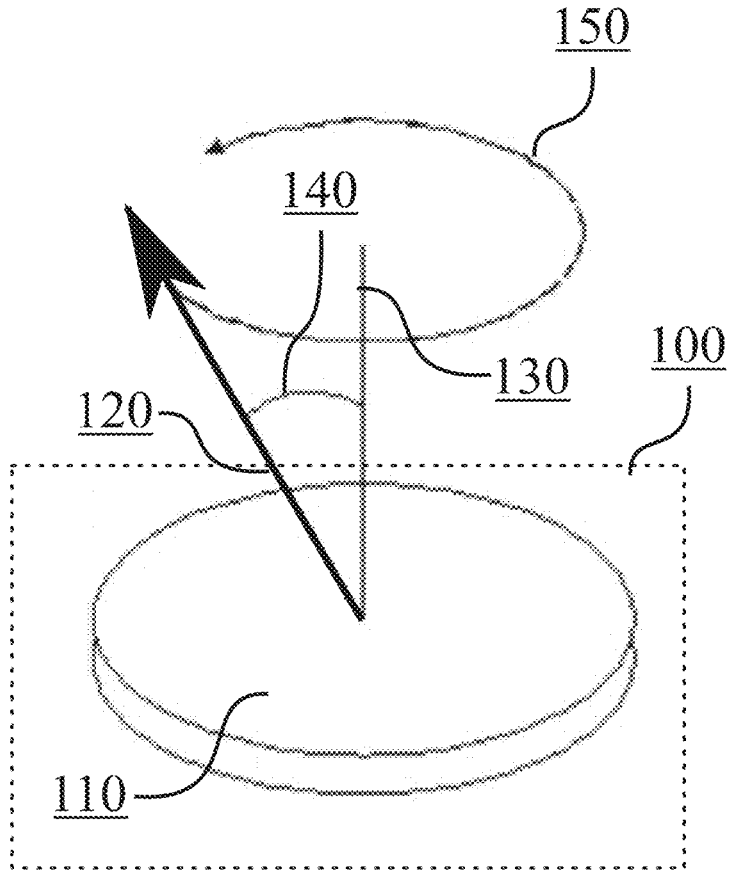
FIG. 1 illustrates operation of a MEMS mirror in accordance with at least some embodiments of the present invention.

FIG. 1 illustrates operation of a MEMS mirror in accordance with at least some embodiments of the present invention. In FIG. 1, MEMS mirror apparatus is denoted by 100. MEMS mirror, or a surface of MEMS mirror more specifically, is denoted by 110. At least one outgoing beam is denoted by 120, normal to the surface 110 is denoted by 130, deflection angle is denoted by 140 and circular scan is shown by arrow 150. Even though circular scan 150 is shown as an example in FIG. 1, at least some embodiments of the present invention may be used to perform Lissajous scanning additionally, or alternatively.

In some embodiments of the present invention, MEMS mirror 110 may be tilted and a laser beam may be directed using MEMS mirror 110 to provide at least one outgoing beam 120. Thus, circular scan 150 may be provided by rotating at least one outgoing beam 120 around normal 130. MEMS mirror 110 may be tilted by deflection angle 140 as well.

Normal 130 may refer to a vertical direction. The expression "vertical" may mean a direction which is identical with the normal to the surface of the Earth and the expression "horizontal" may mean a direction which is perpendicular to the normal to the surface of the Earth. In some embodiments, normal 130 may be related to MEMS mirror apparatus 100. For instance, the expression "vertical" may mean a direction which is identical with normal 130 of MEMS mirror apparatus 100 and "horizontal" may mean a direction which is perpendicular to normal 130 of MEMS mirror apparatus 100.

Figure 2:
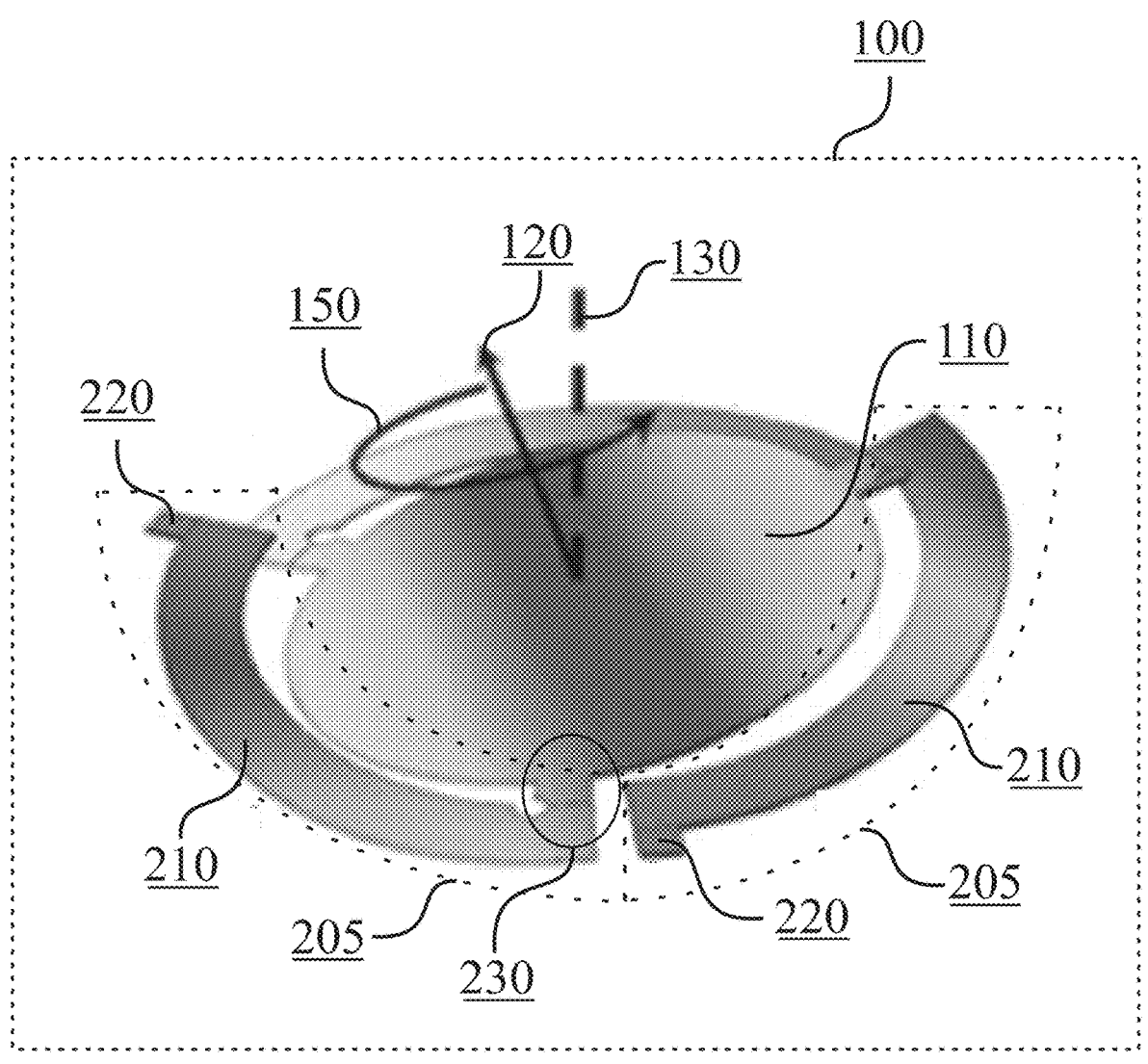
FIG. 2 illustrates driving of a MEMS mirror in accordance with at least some embodiments of the present invention.

FIG. 2 illustrates driving of a MEMS mirror in accordance with at least some embodiments of the present invention. FIG. 2 may illustrate a part of MEMS mirror apparatus 100 of FIG. 1 for example. MEMS mirror apparatus 100 may comprise MEMS mirror 110. Similarly as in FIG. 1, outgoing beam is denoted by 120, normal is denoted by 130 and circular scan is denoted by 150.

In FIG. 2, examples of actuation units 205 are shown. MEMS mirror apparatus 100 may comprise at least three actuation units 205. In general, a MEMS mirror may be a mirror, such as mirror 110, which comprises coupling points for each actuation unit 205 such that each actuation unit 205 may control tilting of the MEMS mirror.

Each actuation unit 205 may comprise actuator 210, such as a piezo-spring, anchor 220 and coupler 230 between actuator 210 and mirror 110. Actuator 210 may be referred to as a piezoelectric actuator as well. Actuation units 205 may be configured to cause a scanning motion for circular scan 150, i.e., to cause the trajectory of circular scan 150 by controlling movement of MEMS mirror 110. In some embodiments of the present invention, the scanning motion may be referred to as a wobbling mode scanning motion, e.g., if circular scan 150 is performed. For instance, wobbling mode may be exploited in Light Detection and Ranging, LiDAR, applications.

Figure 3:
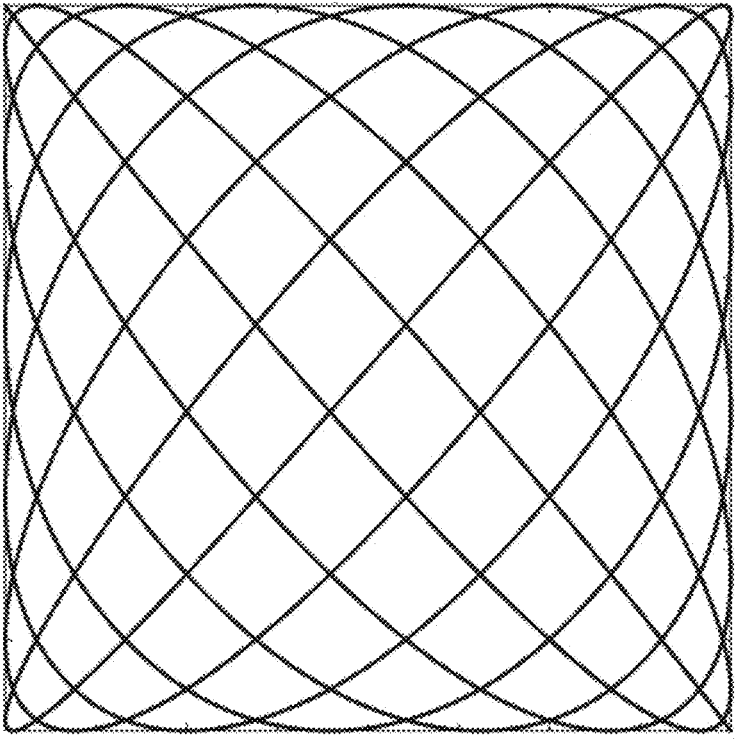
FIG. 3 illustrates Lissajous scanning in accordance with at least some embodiments of the present invention.

Alternatively, the scanning motion may be referred to as a Lissajous mode for example if MEMS mirror 100 is tilted horizontally and vertically in an unsynchronized manner. FIG. 3 illustrates scanning pattern of Lissajous scanning. Lissajous scanning may be either synchronized (stable) or unsynchronized (unstable). In synchronous Lissajous scanning the scanning pattern may be stable (ratio of the horizontal and vertical oscillation frequencies is n m where n and m are integers). In unsynchronous Lissajous scanning the scanning pattern may vary with time.

LiDARs may use electric motor operated MEMS mirrors 110 to scan beam 120, which may lead to large systems. Scanning mirrors may be MEMS actuators that can provide small sizes and low power consumption. MEMS scanners may use either built-in electrostatic actuation or external magnetic or galvanic actuators. Electrostatic actuation May require high driving voltages (up to hundreds of volts). Galvanic actuators may allow large scan angles, but make the system rather large. Embodiments of the present invention therefore provide low power consumption and wide deflection angles for circular and/or Lissajous scanning using a MEMS mirror apparatus. Also, high tolerance to mechanical breakage is provided to enable robust (and durable) MEMS mirrors.

Figure 4:
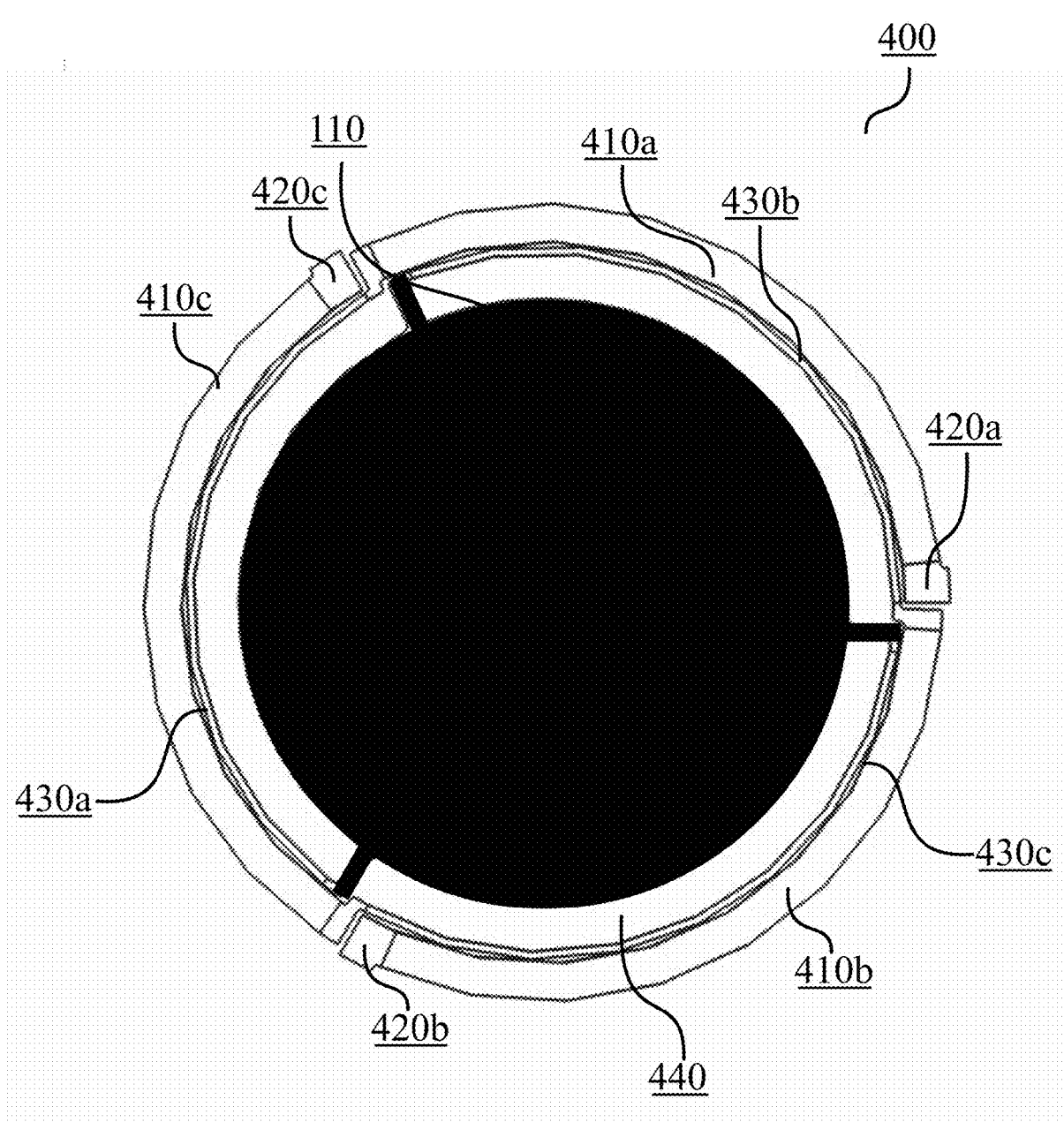
FIG. 4 illustrates a first MEMS mirror apparatus in accordance with at least some embodiments of the present invention.

FIG. 4 illustrates a first MEMS mirror apparatus in accordance with at least some embodiments of the present invention. MEMS mirror apparatus 400 of FIG. 4 may illustrate a part of MEMS mirror apparatus 100 of FIG. 1 for example. MEMS mirror apparatus 400 may comprise MEMS mirror 110. Moreover, MEMS mirror apparatus 400 may comprise three actuation units. In some embodiments, MEMS mirror apparatus 400 may comprise four or more actuation units as well.

A first actuation unit may comprise first actuator 410a, first anchor 420a and first stress relief unit 430a, second actuation unit may comprise second actuator 410b, second anchor 420b and second stress relief unit 430b and third actuation unit may comprise third actuator 410c, third anchor 420c and third stress relief unit 410c. Hence, MEMS mirror apparatus 400 may be for example a 2D scanning mirror with actuators 410a-c, such as piezoelectric actuators. MEMS mirror apparatus 400 may be arranged for example to perform circular scanning. Stress relief units 430a-c may be, e.g., lever arms. Lever arms 430a-c may be arranged to go along a periphery of MEMS mirror 110 but there may be gap 440 between MEMS mirror 110 and each of lever arms 430a-c.

MEMS mirror apparatus 400 may hence comprise at least three actuation units, wherein each actuation unit comprises one actuator 410a-c, one anchor 420a-c and one stress relief unit 430a-c, wherein each stress relief unit 430a-c may be coupled to MEMS mirror 110 from one end and to actuator 410a-c from another end. That is, for example first stress relief unit 430a may be coupled to MEMS mirror 110 from one and to first actuator 410a from another end.

Moreover, each actuator 410a-c may be coupled to one anchor 420a-c and one lever arm 430a-c. That is, first actuator 410a may be coupled to first anchor 420a from one end and to first lever arm 430a from another end. In some embodiments, there may be a frame (not shown in FIG. 4) around, or within, MEMS mirror apparatus 100 and actuators 410a-c may be coupled to the frame via separate anchors 420a-c.

In some embodiments, a control device may be configured to generate control signals for each actuation unit, i.e., for each actuator 410a-c, for a resonant operation of MEMS mirror apparatus 400. Frequencies of the control signals may be substantially equal for all actuation units, but phases of the control signals may differ. A phase shift between the control signals may be determined in order to realize circular scanning pattern and each actuator 410a-c may be excited by an individual control/driving signal. The control signals may have the same frequency, but constant phase shift between the signals. For instance, the phase shift may be 120 degrees with three actuation units and 90 degrees with four actuation units. Excited by the control signals, actuators 410a-c may oscillate in vertical direction. MEMS mirror 110 may be connected to all actuation units and oscillate in the wobbling mode, to provide circular reflection pattern of the normally incident laser beam 120.

Stress relief unit 430a-c may provide high tolerance to mechanical breakage and enable large reflection angles. Stress relief units 430a-c may be arranged to enhance vertical displacement of actuators 410a-c and thus tilt angle of MEMS mirror 110. Alternatively, or in addition, stress relief units 430a-c may prevent breakage of actuators 410a-c and allow large tilt and scanning angles of MEMS mirror 110, e.g., up to +15 degrees mechanical tilt angle.

With reference to FIG. 1 again, MEMS mirror apparatus 400 shown in FIG. 4 may provide circular scanning 150 of laser beam 120 with low driving voltage and large optical angle, which may be particularly beneficial in case of LiDAR applications, because circular scanning 150 can be transformed into 3D scanning by using special optical components. Another application for a circular scanner is a component of a hyperspectral light source.

Actuators 410a-c may be arranged to work in resonance to provide efficient actuation even at very low driving voltage of, e.g., about 1V. Phase shift between the control signals may be used to cause wobbling of MEMS mirror 110 and circular scanning of laser beam 140.

In the MEMS mirror apparatus of FIG. 4, each stress relief unit 430a-c may connect a separate actuator 410a-c to MEMS mirror 110. Stress relief units 430a-c may therefore provide mechanical amplification of vertical displacement of MEMS mirror 110. Stress relief units 430a-c may be narrow such that those can be placed in gap 440 between MEMS mirror 110 and actuators 410a-c, thereby saving space. In addition, stress relief units 430a-c may provide flexibility to act as a stress-relief unit between actuator 410a-c and attachment points of MEMS mirror 110.

Figure 5:
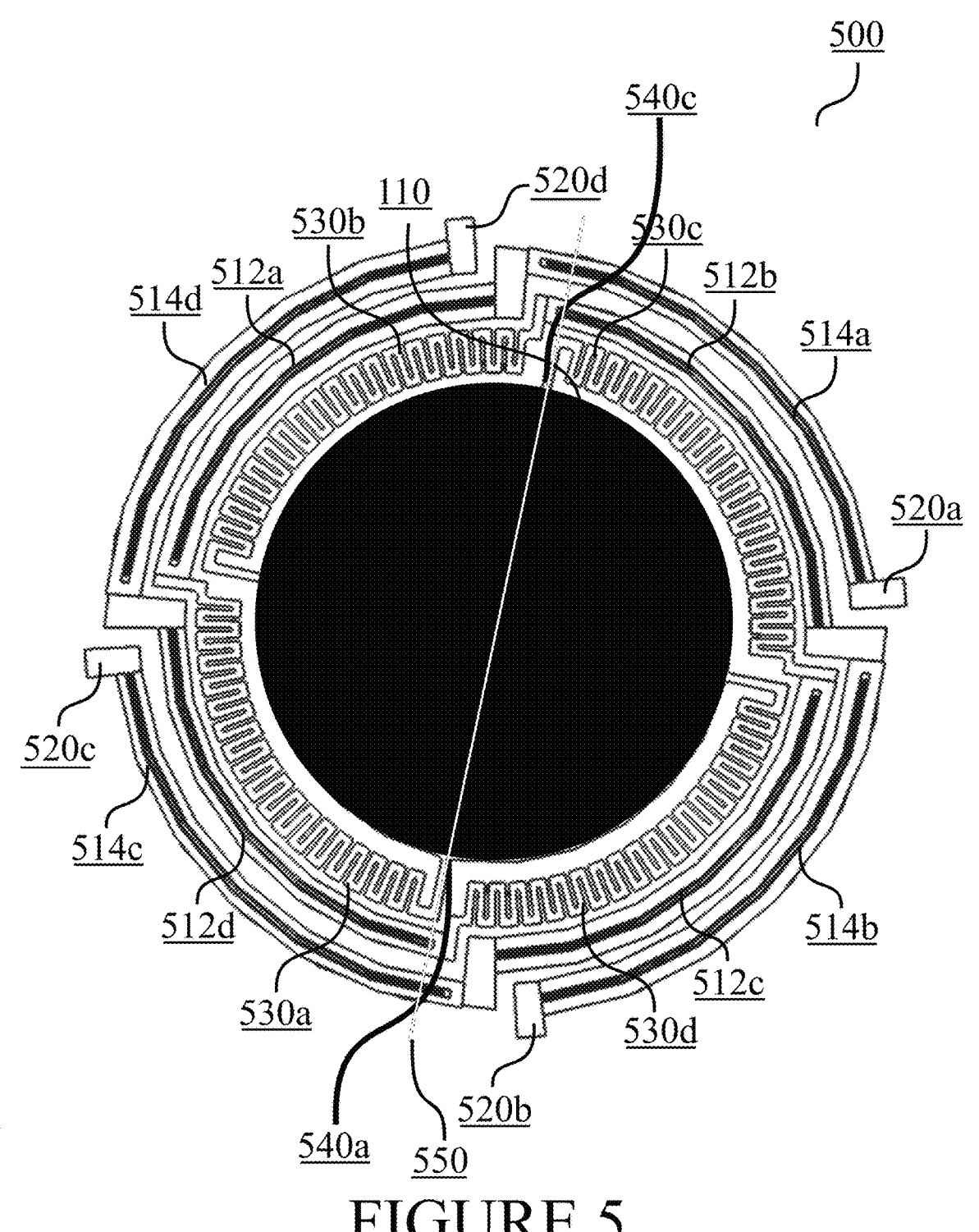
FIG. 5 illustrates a second MEMS mirror apparatus in accordance with at least some embodiments of the present invention.

FIG. 5 illustrates a second MEMS mirror apparatus in accordance with at least some embodiments of the present invention. FIG. 5 may illustrate a part of MEMS mirror apparatus 100 of FIG. 1 for example. MEMS mirror apparatus 500 may comprise MEMS mirror 110. Moreover, MEMS mirror apparatus 500 may comprise four actuation units. A first actuation unit may comprise first inner actuator 512a, first outer actuator 514a, first anchor 520a and stress relief unit 530a. A second actuation unit may comprise second inner actuator 512b, second outer actuator 514b, second anchor 520b and second stress relief unit 530b. A third actuation unit may comprise third inner actuator 512c, third outer actuator 514c, third anchor 520c and third stress relief unit 530c. A fourth actuation unit may comprise fourth inner actuator 512d, fourth outer actuator 514d, fourth anchor 520d and fourth stress relief unit 530d.

Said actuation units may work in resonance to provide efficient actuation even at very low driving voltage, e.g., of about 1V. Stress relief units 530a-d may be used to provide high tolerance to breakage and act as lever arms, to enhance vertical displacement of the actuation units and allow large scanning angles. All actuation units and stress relief units 530a-d may be identical.

Stress relief units 530a-d may be combined lever arm/ stress relief units and have meander structures. Use of meander structures increases the moment of inertia of the vibrating structure and reduces the spring constant to lower the mechanical resonance frequency suitable for Lissajous scanning.

The second MEMS mirror apparatus shown in FIG. 5 is hence particularly beneficial in case of Lissajous scanning of laser beam 120 with low driving voltage and large optical angle, which is important at least for LiDAR applications. LiDARs may scan 2D area and Lissajous scanning is the only way to scan 2D area with high-frequency signals driving both X and Y axes, i.e., in horizontal and vertical directions.

Each actuation unit may be excited by an individual control signal as in the embodiment of FIG. 4. Control signals for different pairs of actuation units may have different frequencies. For instance, control signals for each of outer actuators 514a-d may be different. Moreover, control signals for actuators in a same pair may have 180 degree phase shift. That is, phase difference of control signals of first outer actuator 514a and second outer actuator 514b may be 180 degrees. Similarly, phase difference of control signals of third outer actuator 514c and fourth outer actuator 514d may be 180 degrees as well. Phase difference between control signals of first actuator 514a and third actuator 514 may then be 90 degrees while phase difference between control signals of second actuator 514b and fourth actuator 514d may be 90 degrees as well. The first actuation unit and the second actuation units may thus from a first pair and the third actuation unit and the fourth actuation unit may form a second pair. When excited by the control signals, actuators 512a-d and 514a-d may oscillate in vertical direction. Therefore, MEMS mirror 110 may be caused to oscillate in Lissajous mode.

MEMS mirror apparatus 500 may hence comprise at least two pairs of actuation units, wherein a first actuation unit of a first pair of actuation units comprises stress relief unit 530a, inner actuator 512a and outer actuator 514a. Stress relief unit 530a may be coupled to MEMS mirror 110 and to inner actuator 512a. One end of inner actuator 512a may be coupled to stress relief unit 530a and another end of inner actuator 512a may be coupled to outer actuator 514a. Stress relief unit 530a of the first actuation unit of the first pair of actuation units may be in between mirror 110 and inner actuator 512d of a second actuation unit of the second pair of actuation units. Inner actuator 512a of the first actuation unit of the first pair of actuation units may be in between stress relief unit 530b of the second actuation unit of the first pair of actuation units and outer actuator 514d of a second actuation unit of a second pair of actuation units.

That is, MEMS mirror apparatus 500 may comprise at least two pairs of actuation units, wherein each actuation unit comprises two actuators, i.e., an inner actuator and an outer actuators, and a stress relief unit. Each stress relief unit may be coupled to mirror 110 and a separate inner actuator. Each inner actuator may be coupled to a separate outer actuator and a separate stress relief unit. Each outer actuator may be coupled to a separate inner actuator and the frame. Each pair of actuation units may comprise two identical actuation units, wherein for example point of connection 540a of a first actuation unit of a first pair is located on imaginary line 550 passing through the geometrical centre of the MEMS mirror apparatus 500 to point of connection 540c of a first actuation unit of a second pair, wherein points of connection 540a and 540c are connection points to the frame.

Figure 6:
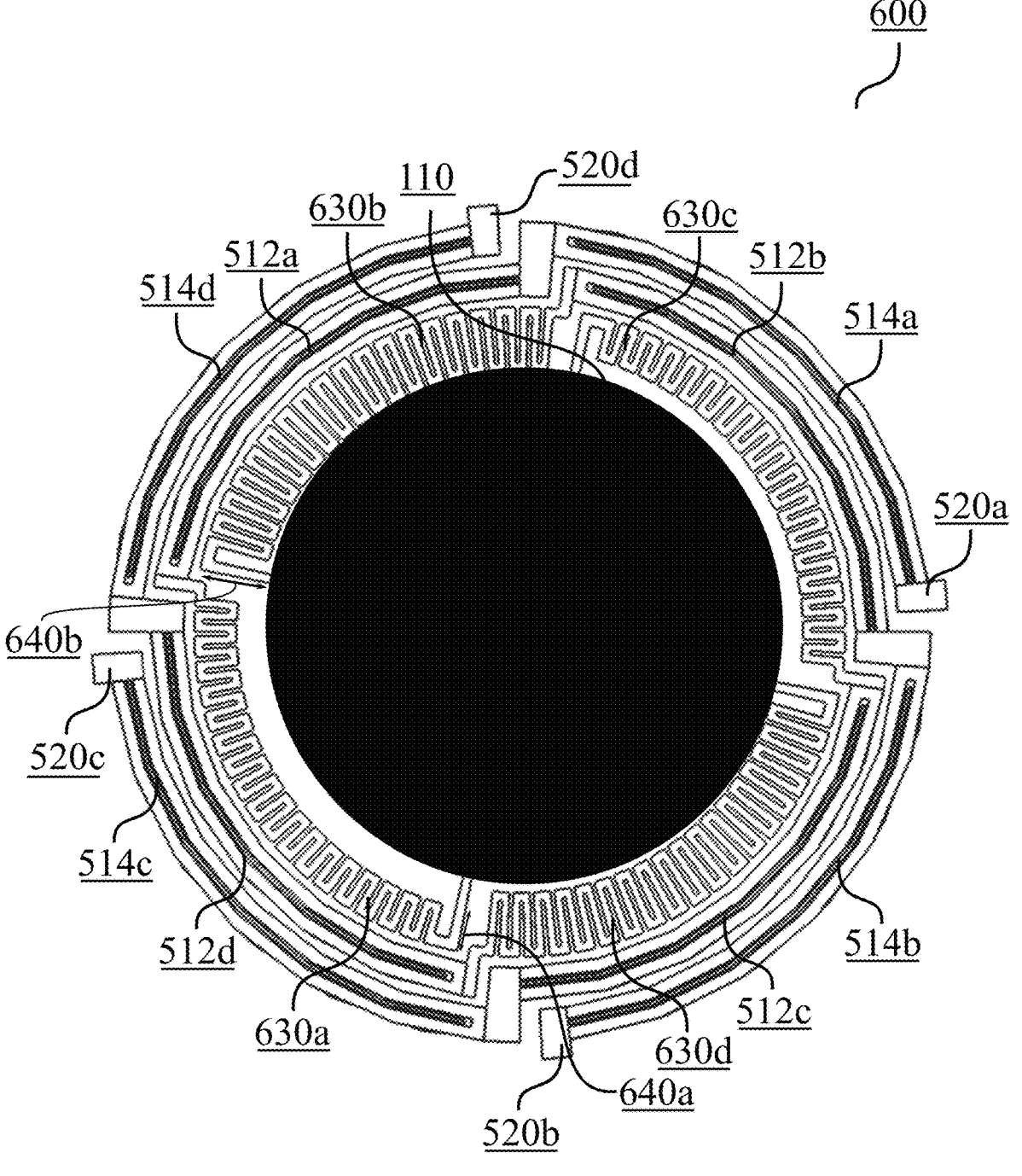
FIG. 6 illustrates a third MEMS mirror apparatus in accordance with at least some embodiments of the present invention.

FIG. 6 illustrates a third MEMS mirror apparatus in accordance with at least some embodiments of the present invention. MEMS mirror apparatus 600 shown in FIG. 6 is otherwise the same as MEMS mirror apparatus 500 of FIG. 5, but in case of MEMS mirror 600 actuation units may not be identical. That is, pairs of actuation units, or more specifically pairs of stress relief units, such as meander structures, may have different geometrical dimensions. Thus, actuation units can be configured to provide mechanical resonances at different frequencies optimally for Lissajous scanning. Lissajous scanning requires oscillation frequencies of X- and Y-axis to be different and asymmetry of the actuation units makes it possible to have optimal resonance frequencies for X- and Y-axis. Asymmetric actuation units enable excitation of MEMS mirror apparatus 600 at frequencies optimal for Lissajous scanning.

That is, the first actuation unit of the first pair of actuation units may be different compared to the second actuation unit of the first pair of actuation units. For instance, stress relief unit 630a of the first actuation unit of the first pair of actuation units and stress relief unit 630b of the second actuation unit of the first pair of actuation units may be different. Stress relief unit 630a and stress relief unit 630b may, e.g., have a meander structure and height 640a of a meander line of stress relief unit 630a of the first actuation unit of the first pair of actuation units may be smaller than height 640b of a meander line of the stress relief unit of second actuation unit 630b of the first pair of actuation units. The meander structure makes it possible to increase the moment of inertia of the vibrating structure and reduce the spring constant to lower the mechanical resonance frequency suitable for Lissajous scanning.

Hence, pairs of actuation units may have different geometrical dimensions and be arranged to provide mechanical resonances at different frequencies optimal for Lissajous scanning. That is, asymmetric design shown in FIG. 6 allows for optimization of resonant frequencies, which is important at least for Lissajous scanning.

Also in case of MEMS mirror apparatus 600, piezoelectric actuation allows for low voltage excitation (~1V). As in case of the example apparatus of stress relief units 630a-d allow for large tilt angle and also act as lever arms, thereby enhancing vertical displacement of the actuation units. Therefore, MEMS mirror apparatus 600 may be particularly beneficial for long-range LiDARs.

Figure 7:
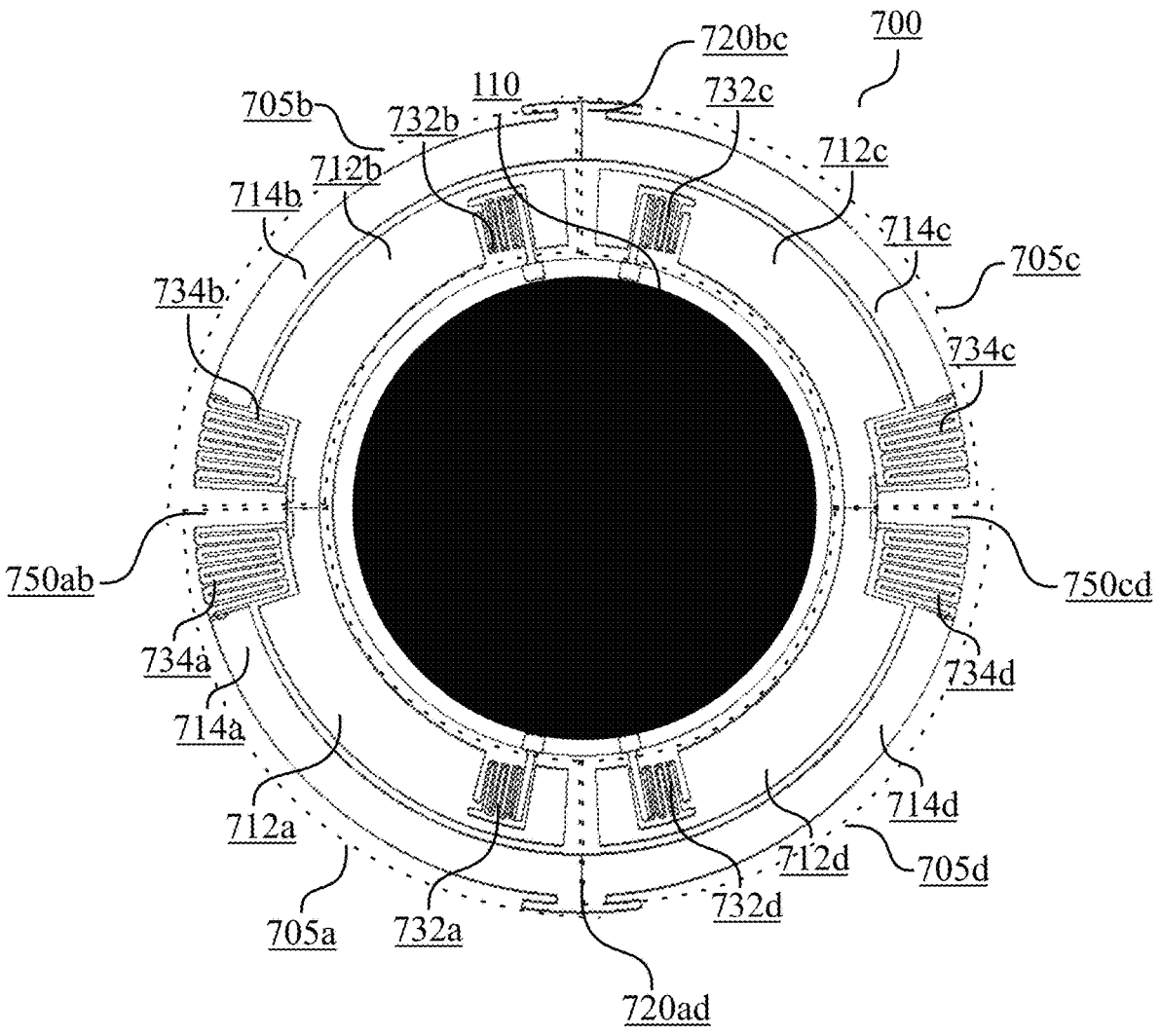
FIG. 7 illustrates a fourth MEMS mirror apparatus in accordance with at least some embodiments of the present invention.

FIG. 7 illustrates a fourth MEMS mirror apparatus in accordance with at least some embodiments of the present invention. MEMS mirror apparatus 700 shown in FIG. 7 may be used to provide two-dimensional scanning with low driving voltage and large optical angle using laser beam 120. Depending on application geometry of MEMS mirror apparatus 700, MEMS mirror apparatus 700 may be tuned for either circular or Lissajous scanning. This is particularly beneficial for LiDAR applications, because scanning mirrors are key components of LiDARs.

As shown in FIG. 7, MEMS mirror apparatus may comprise MEMS mirror 110 and at least two pairs of actuation units, wherein a first pair of actuation units may comprise actuation units 705a and 705b, and a second pair of actuation units may comprise actuation units 705c and 705d. Inner actuators are denoted by 712a-d, inner stress relief units by 732a-d, outer actuators by 714a-d and outer stress relief unit by 734a-d.

Hence, MEMS mirror apparatus 700 may comprise two pairs of outer actuators, wherein the first pair comprises actuators 714a and 714b, and the second pair comprises actuators 714c and 714d. Similarly, MEMS mirror apparatus 700 may comprise two pairs of outer stress relief units, wherein the first pair comprises outer stress relief units 734a and 734b and the second pair comprises outer stress relief units 734c and 734d. MEMS mirror apparatus 700 may further comprise two pairs of inner actuators, wherein the first pair comprises inner actuators 712a and 712b, and the second pair comprises inner actuators 712c and 712d. MEMS mirror apparatus 700 may also comprise two pairs of inner stress relief units, wherein the first pair comprises inner stress relief units 732a and 734b, and the second pair comprises inner stress units 734c and 734d. All actuation units 705a-d may be identical.

Each actuation unit 705a-d may comprise an inner actuator, an inner stress relief unit, an outer actuator and an outer stress relief unit. That is, for example first actuation unit 705a of the first pair of actuation units may comprise inner actuator 712a, inner stress relief unit 732a, outer actuator 714a and outer stress relief unit 734a.

Each pair of outer actuators may be connected to a frame via a single common point, i.e., via the same anchor. For instance, outer actuator 714a and 714d may be connected to the frame via common anchor point 720ad.

Each outer actuator 714a-d may be coupled to an individual, separate outer stress relief unit 734a-d. For instance, outer actuator 714a of first actuation unit 705a of the first pair of actuation units may be coupled to outer stress relief unit 734a while outer actuator 714b of second actuation unit 705b of the first pair of actuation units may be coupled to outer stress relief unit 734b. One end of outer actuator 714a may be coupled to anchor 720ad, wherein anchor 720ad is between outer actuator 714a and outer actuator 714d of second actuation unit 705d of the second pair of actuation units. Another end of outer actuator 714a may be coupled to outer stress relief unit 734a. Outer stress relief unit 734a may be towards outer stress relief unit 734b of second actuation unit 705b of the first pair of actuation units. There may be gap 750ab between outer stress relief unit 734a and outer stress relief unit 734b.

Each inner actuator 712a-d may be coupled to or comprise an individual, separate inner stress relief unit 732a-d, respectively. For instance, inner actuator 712a may comprise inner stress relief unit 732a while inner actuator 712b may comprise inner stress relief unit 732b. As shown in FIG. 7, inner stress relief unit 732a and inner stress relief unit 732b may be located close to an end of inner actuator 712a and inner actuator 712b, respectively. Alternatively, inner stress relief unit 732a and inner stress relief unit 732b may be at the end of inner actuator 712a and inner actuator 712b, respectively. In such a case, inner actuator 712a may be coupled to inner stress relief unit 732a while inner actuator 712b may be coupled to inner stress relief unit 732b.

Each inner stress relief unit may be coupled to mirror 110. That is, inner stress relief unit 732a may be coupled to mirror 110 and also inner stress relief unit 732b may be coupled to mirror 110 at different places. Each inner stress relief unit 732a-d may be at an opposite end of an actuation unit compared to a corresponding outer stress relief unit 734a-d. Hence, inner stress relief unit 712a may be at an opposite end of first actuation unit 705a compared to outer stress relief unit 714a.

At least one of an inner stress relief unit 732a-d and/or an outer stress relief unit 734a-d of an actuation unit may have a meander structure. That is, for example inner stress relief unit 732a and/or outer stress relief unit 734a may have a meander structure as shown in FIG. 7. The meander structure may refer to a line which meanders, i.e., to a meander line. The meander line may be made of silicon. Stress relief units 732a-d may be identical, i.e., the meander structures may be identical. Similarly, stress relief units 734a-d may be identical.

An inner stress relief unit may be at one end of an inner actuator and an outer stress relief unit may be at one end of an outer actuator, and the outer stress relief unit may penetrate partly to the inner actuator. For instance, inner stress relief unit 732a may be at one end of inner actuator 712a and outer stress relief unit 734a may be at one end of outer actuator 714a, and outer stress relief 734a unit may penetrate partly to inner actuator 712a. Hence, the stress relief unit may be more flexible, to lower the mechanical stress in the stress relief unit at large tilt angles.

Also in case of MEMS mirror 700, piezoelectric actuation enables low voltage excitation (~1V) and stress-relief units 712a-d and 714a-d provide high tolerance to mechanical breakage and act as lever arms, enhancing vertical displacement of actuation unit 705a-d, making it possible to achieve large reflection angles. Piezoelectric actuators working at the resonance provide efficient actuation even at very low driving voltage of about 1V. Special design of actuation units 705a-d allows for tuning of X and Y resonance frequencies in wide range, making it possible to have optimal resonance frequencies for two-dimensional scanning. As in other embodiments, actuators 712a-d and 714a-d may be excited by individual driving signal.

Figure 8:
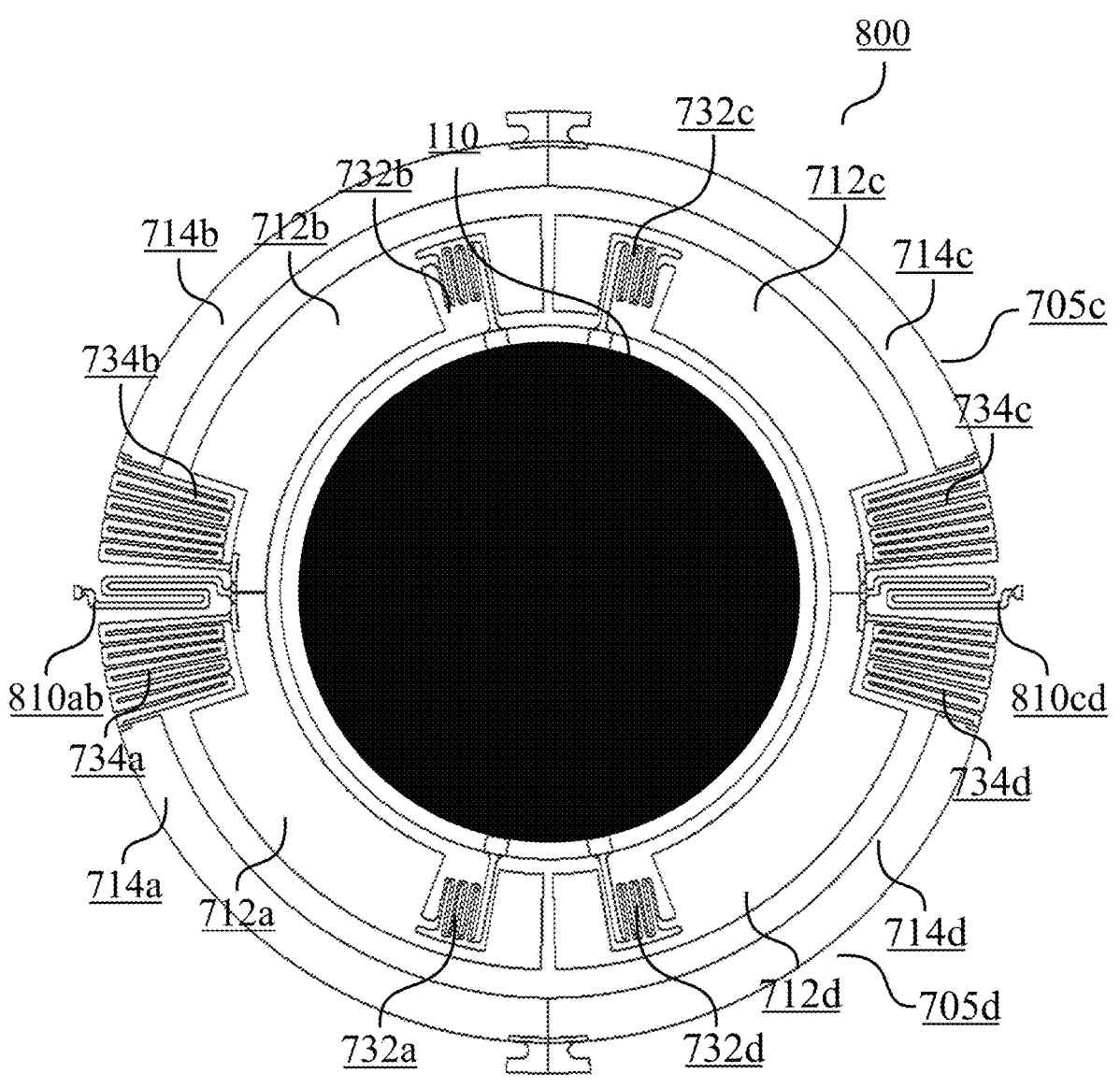
FIG. 8 illustrates a third MEMS mirror apparatus in accordance with at least some embodiments of the present invention.

FIG. 8 illustrates a fourth MEMS mirror apparatus in accordance with at least some embodiments of the present invention. MEMS mirror apparatus 800 of FIG. 8 comprises the same components as MEMS mirror apparatus 700 of FIG. 7. In addition, MEMS mirror apparatus 800 may comprise coupler 810ab between outer relief units 734a and 734b. MEMS mirror apparatus 800 may comprise coupler 810cd between outer relief units 734c and 734d as well.

Couplers 810ab and 810cd may provide a pathway for electrical contacts to inner actuators 712a-d and sensors (not shown in FIG. 8). Couplers 810ab and 810cd may also allow torsional motion of inner actuators 712a-d and MEMS mirror 110 around the x-axis, in a horizontal direction, and at the same time provide mechanical rigidity against lateral displacements and torsional motion of inner actuators 712a-d around the y-axis, in a vertical direction.

Moreover, as shown in FIG. 8, inner stress relief units 732a-d and outer stress relief units 734a-d may have different geometrical meander structures. For instance, inner stress relief unit 732a and outer stress relief unit 734a may have meander structures and a height of a meander structure of inner stress relief unit 732a may be smaller than a height of a meander structure of outer stress relief unit 734a.

It is to be understood that the embodiments of the invention disclosed are not limited to the particular structures, process steps, or materials disclosed herein, but are extended to equivalents thereof as would be recognized by those ordinarily skilled in the relevant arts. It should also be understood that terminology employed herein is used for the purpose of describing particular embodiments only and is not intended to be limiting.

Reference throughout this specification to one embodiment or an embodiment means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment. Where reference is made to a numerical value using a term such as, for example, about or substantially, the exact numerical value is also disclosed.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and examples of the present invention may be referred to herein along with alternatives for the various components thereof. It is understood that such embodiments, examples, and alternatives are not to be construed as de facto equivalents of one another, but are to be considered as separate and autonomous representations of the present invention.

Furthermore, the described features, structures, or characteristics may be combined in any suitable manner in one or more embodiments. In the preceding description, numerous specific details are provided, such as examples of lengths, widths, shapes, etc., to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

The verbs "to comprise" and "to include" are used in this document as open limitations that neither exclude nor require the existence of also un-recited features. The features recited in depending claims are mutually freely combinable unless otherwise explicitly stated. Furthermore, it is to be understood that the use of "a" or "an", that is, a singular form, throughout this document does not exclude a plurality.

INDUSTRIAL APPLICABILITY

At least some embodiments of the present invention find industrial application in MEMS mirrors.

Acronyms List

LiDAR Light Detection and Ranging
MEMS Microelectromechanical System
MOEMS Micro-Opto-Electromechanical System

REFERENCE SIGNS LIST

100, 400, 500, 600, 700, 800 MEMS mirror apparatus
110 MEMS mirror
120 Outgoing beam
130 Normal
140 Deflection angle
150 Circular scan
205, 705 Actuation unit
210, 410 Actuator
220, 420, 720 Anchor
230 Coupler
430, 530, 630 Stress relief unit
440, 750 Gap
512, 712 Inner actuator
514, 714 Outer actuator
540 Point of connection to the frame
550 Line
640 Height of meander line
732 Inner stress relief unit
734 Outer stress relief unit
810 Coupler

The invention claimed is:

1. A Microelectrical System, MEMS, mirror apparatus, comprising:
   a MEMS mirror;
   at least two pairs of actuation units, wherein each pair comprises a first and a second actuation unit and a first actuation unit of a first pair of actuation units comprises a stress relief unit, an inner actuator and an outer actuator, and
   the stress relief unit is coupled to the MEMS mirror and to the inner actuator,
   one end of the inner actuator is coupled to the stress relief unit of the actuation unit and another end of the inner actuator is coupled to the outer actuator of the actuation unit,
   the stress relief unit of the first actuation unit of the first pair of actuation units is in between the MEMS mirror and an inner actuator of a second actuation unit of a second pair of actuation units, and
   the inner actuator of the first actuation unit of the first pair of actuation units is in between a stress relief unit of a second actuation unit of the first pair of actuation units and an outer actuator of a second actuation unit of a second pair of actuation units.

2. The MEMS apparatus according to claim 1, wherein the stress relief units of all the actuation units comprise meander structures.

3. The MEMS apparatus according to claim 1, wherein all actuation units of the at least two pairs of actuation units are identical.

4. The MEMS apparatus according to claim 1, wherein the first actuation unit of the first pair of actuation units is different compared to the second actuation unit of the second pair of actuation units.

5. The MEMS apparatus according to claim 4, wherein the stress relief unit of the first actuation unit of the first pair of actuation units and the stress relief unit of the second actuation unit of the first pair of actuation units comprise meander structures and a height of a meander line of the stress relief unit of the first actuation unit of the first pair of actuation units is smaller than a height of the stress relief unit of the second actuation unit of the first pair of actuation units.

6. A Microelectrical System, MEMS, mirror apparatus, comprising:
  a MEMS mirror;
  at least two pairs of actuation units, wherein an actuation unit of a first pair comprises an inner actuator, an inner stress relief unit, an outer actuator and an outer stress relief unit, and
  one end of the inner actuator is coupled to or comprises the inner stress relief unit of the actuation unit and another end of the inner actuator is coupled to the outer actuator via the outer stress relief unit,
  the inner stress relief unit is coupled to the MEMS mirror,
  one end of the outer actuator is coupled to an anchor between the outer actuator and an outer actuator of an actuation unit of a second pair of actuation units and another end of the outer actuator is coupled to the outer stress relief unit.

7. The MEMS mirror apparatus according to claim 6, wherein the inner and the outer stress relief units are at opposite ends of the actuation unit.

8. The MEMS mirror apparatus according to claim 6, wherein the outer actuator of the first pair of actuation units is coupled to a frame via a common point and the outer actuator of the actuation unit of the second pair is coupled to the frame via the same common point.

9. The MEMS mirror apparatus according to claim 6, wherein the outer stress relief unit is towards an outer stress relief unit of another actuation unit of the first pair with a gap in between the outer stress relief unit and the outer stress relief unit of the actuator of said another actuation unit.

10. The MEMS apparatus according to claim 6, wherein the gap between the outer stress relief unit and the outer stress relief unit of the actuator of said another actuation unit of the first pair comprises a coupler.

11. The MEMS mirror apparatus according to claim 6, wherein at least one of the inner stress relief unit and/or the outer stress relief unit comprises a meander structure.

12. The MEMS mirror apparatus according to claim 6, wherein the inner stress relief unit and the outer stress relief units comprise meander structures with different geometrical patterns.

13. The MEMS mirror apparatus according to claim 6, wherein the inner stress relief unit and the outer stress relief unit comprise meander structures and a height of a meander structure of the inner stress relief unit is smaller than a height of a meander structure of the outer stress relief unit.

14. The MEMS mirror apparatus according to claim 6, wherein all actuation units of the at least two pairs of actuation units are identical.

15. The MEMS mirror apparatus according to claim 6, wherein the inner stress relief unit is at one end of the inner actuator and the outer stress relief unit is at one end of the outer actuator, and the outer stress relief unit penetrates partly to the inner actuator.

* * * * *